United States Patent [19]
Okayasu et al.

[11] Patent Number: 6,025,747
[45] Date of Patent: *Feb. 15, 2000

[54] LOGIC SIGNAL SELECTION CIRCUIT

[75] Inventors: Toshiyuki Okayasu, Ohtone-machi; Hiroo Suzuki, Kitamoto, both of Japan

[73] Assignee: Advantest Corp., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/765,539

[22] PCT Filed: Jun. 17, 1996

[86] PCT No.: PCT/JP96/01650
  § 371 Date: Sep. 2, 1997
  § 102(e) Date: Sep. 2, 1997

[87] PCT Pub. No.: WO97/00557
  PCT Pub. Date: Jan. 3, 1997

[30] Foreign Application Priority Data

Jun. 15, 1995 [JP] Japan ................................. 7-172896

[51] Int. Cl.[7] .................................................. H03K 17/62
[52] U.S. Cl. ..................... 327/407; 327/355; 327/298; 326/104
[58] Field of Search ............................ 326/112–115, 119, 326/121, 104; 327/407, 408, 355, 99, 298, 395, 396

[56] References Cited

U.S. PATENT DOCUMENTS 4,986,666 1/1991 Homma et al. .

FOREIGN PATENT DOCUMENTS

1-146188 6/1989 Japan .
1-259621 10/1989 Japan .
5-300002 11/1993 Japan .

*Primary Examiner*—Michael Tokar
*Assistant Examiner*—Don Phu Le
*Attorney, Agent, or Firm*—Muramatsu & Associates

[57] ABSTRACT

It is to achieve a logic signal selection circuit having high timing resolution and high speed. The logic signal selection circuit includes a current input type sense amplifier 320 which is provided with a threshold value which is an output of an equivalent center current generator 310 and positive logic input signals through transfer gates, a current input type sense amplifier 321 which is provided with a threshold value which is an output of an equivalent center current generator 311 and negative logic input signals through transfer gates, a differential amplifier 340 which receives and amplifies an output of the current input type sense amplifier 320 whose delay times are fine adjusted by a delay time adjuster 330, a differential amplifier 341 which receives and amplifies an output of the current input type sense amplifier 321 whose delay times are fine adjusted by a delay time adjuster 331, and a logic circuit 350 which receives both outputs of the differential amplifiers 340 and 341, and generates a logical sum of the both outputs. Because there is no voltage change in the input of the current input type sense amplifier, current flows will not occur to the capacitance C of the transfer gates which are in the OFF state and connected at the input of the current input type sense amplifier. Thus, it is able to output the selected input signal with high timing resolution and with high speed.

17 Claims, 6 Drawing Sheets

LOGIC SIGNAL SELECTION CIRCUIT

TECHNICAL FIELD

This invention relates to a logic signal selection circuit for selecting a high frequency logic signal and outputting the selected logic signal with high timing resolution.

BACKGROUND ART

Because of the increasing operation speed in electric circuits, higher timing resolution is required in electric signals used in such electric apparatuses. In particular, a logic signal selection circuit which selectively outputs a logic signal out of many logic signals is required to have a high timing resolution.

Figure 7:
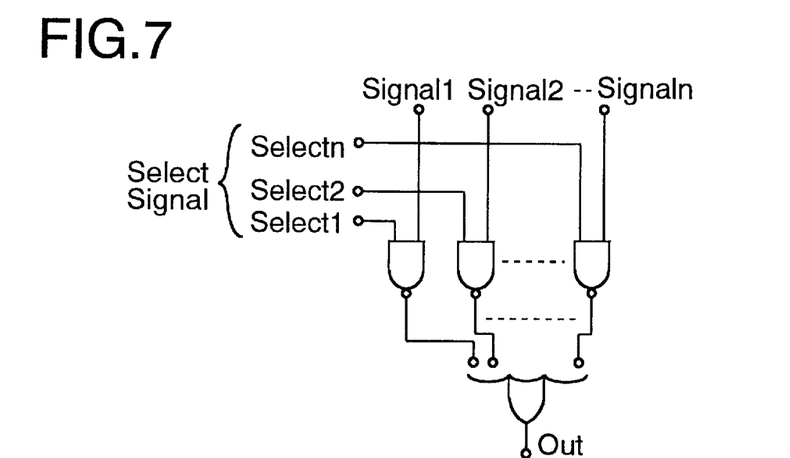
FIG. 7 is a circuit diagram showing a logic signal selection circuit generally used in the conventional technology.

FIG. 7 shows an example of a logic signal selection circuit generally used in the conventional technology. In this example, the number of input signals, which are negative logic, to an OR circuit is equal to the number of input signals n to a NAND circuit.

Figure 8:
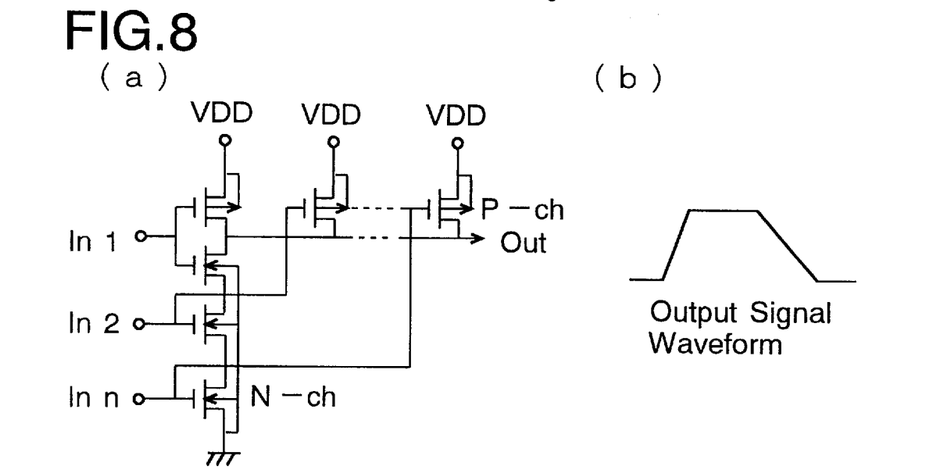
FIG. 8 is a schematic circuit diagram showing n negative logic inputs CMOS OR circuit

FIG. 8(a) shows an example in which an OR circuit having n negative logic inputs is formed of a CMOS circuit. In this circuit example, n gates which are N-channel MOSFETs are connected in series while n gates which are P-channel MOSFETs are connected in parallel. As a consequence, a rising edge of an output signal waveform goes to a high level with a relatively short transition time, since one P-channel MOSFET drives wiring capacitance of the circuit and gate capacitance of the next stage. However, a falling edge of the output signal waveform requires a considerably long time for going down to a low level as shown in FIG. 8(b), since n stages of the N-channel MOSFETs drive the wiring capacitance and the gate capacitance of the next stage. This is because the overall ON resistance is large by the series connection of the n MOSFETs.

Figure 9:
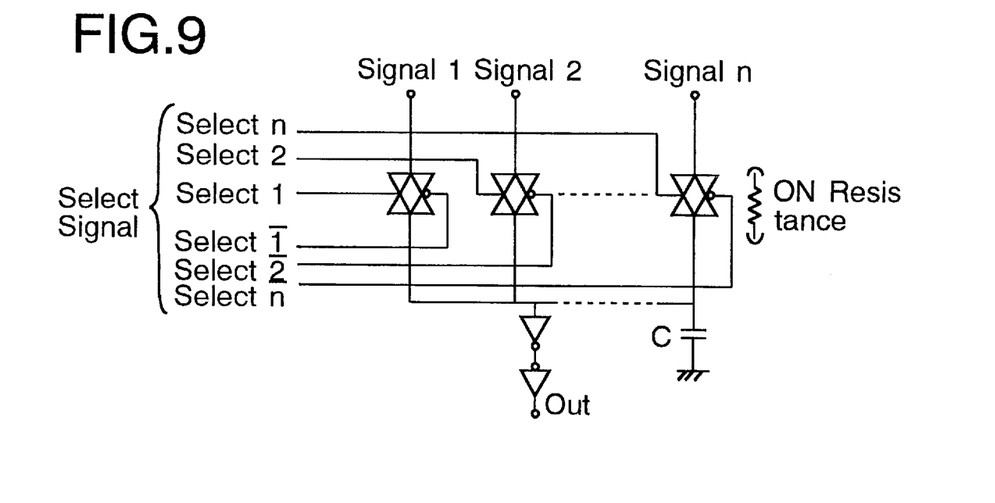
FIG. 9 is a schematic diagram of a logic signal selection circuit using transfer gates.

FIG. 9 shows an example of a logic signal selection circuit using transfer gates. In this example, one transfer gate, which is ON, drives through its ON resistance R, capacitance C of other n-1 transfer gates which are OFF. Therefore, rising and falling waveforms at a wired OR of the outputs of the transfer gates are affected by the capacitance C and the resistance R. Thus, it is not proper to use this circuit examples as a signal selection circuit for high repetition frequency signals.

As in the foregoing, in the conventional logic signal selection circuit, high frequency signal selection is not attainable, since the wiring capacitance, the gate capacitance of the next stage and the capacitance of the transfer gates which are in the OFF state have to be charged by means of voltage changes.

Therefore, it is an object of the present invention to provide a logic signal selection circuit which is capable of selecting a high frequency logic signal with high timing resolution.

DISCLOSURE OF THE INVENTION

Figure 6:
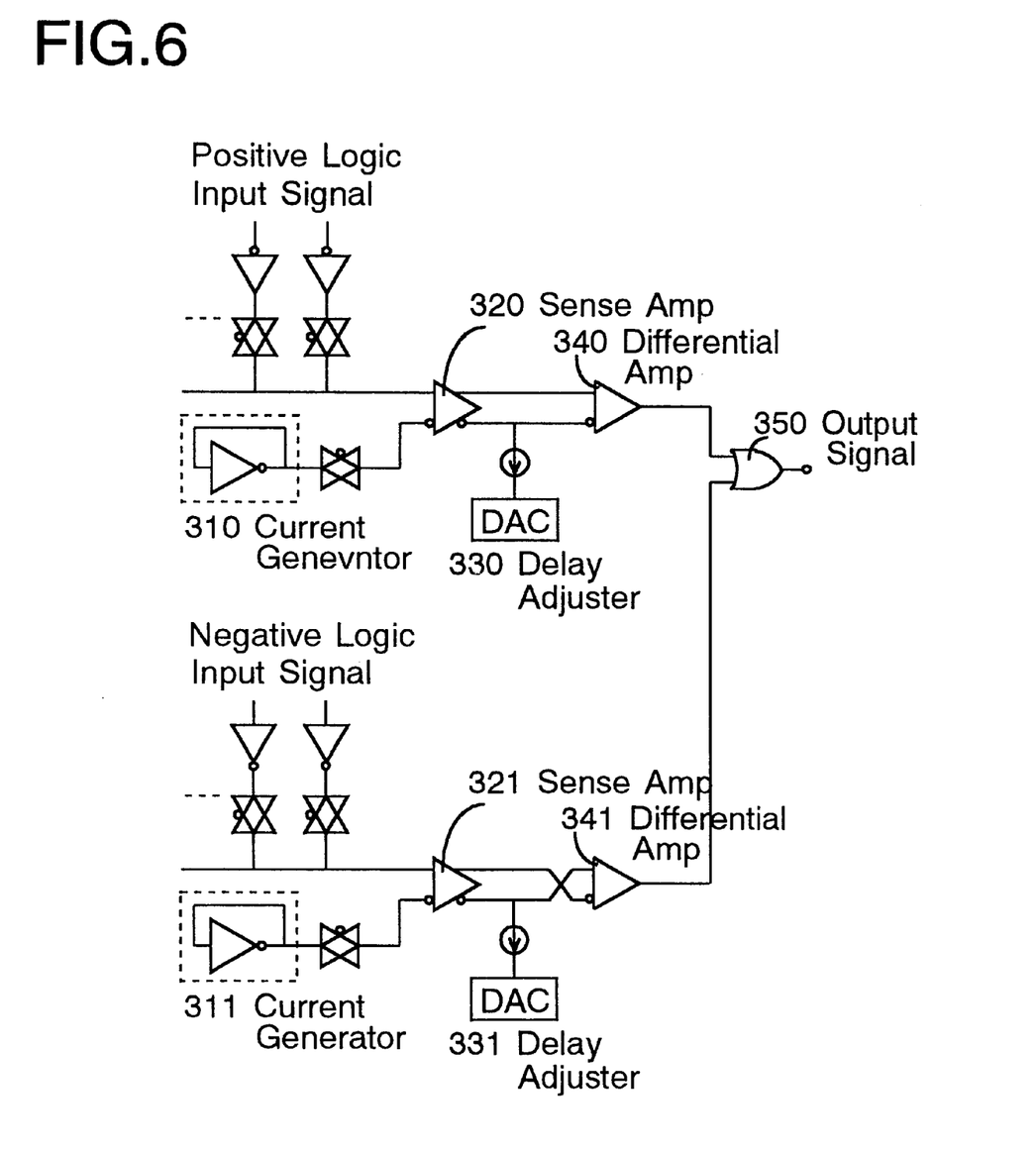
FIG. 6 is a block diagram of the logic signal selection circuit in which positive logic inputs and negative logic inputs are separately provided in accordance with the present invention.

The structure of a logic signal selection circuit of the present invention includes a current input type sense amplifier 320 which is provided with a threshold value which is an output of an equivalent center current generator 310 and positive logic input signals through transfer gates, a current input type sense amplifier 321 which is provided with a threshold value which is an output of an equivalent center current generator 311 and negative logic input signals through transfer gates, a differential amplifier 340 which receives and amplifies an output of the current input type sense amplifier 320 whose delay times are fine adjusted by a delay time adjuster 330, a differential amplifier 341 which receives and amplifies an output of the current input type sense amplifier 321 whose delay times are fine adjusted by a delay time adjuster 331, and a logic circuit 350 which receives both outputs of the differential amplifiers 340 and 341, and generates a logical sum of the both outputs.

Because there is no voltage change in the input of the current input type sense amplifier, current flows will not occur to the capacitance C of the transfer gates which are in the OFF state and are connected at the input of the current input type sense amplifier. Thus, it is able to output the selected input signal with high timing resolution and with high speed.

Further, by classifying the positive logic inputs and the negative logic inputs in separate groups, and providing such separately grouped inputs to the corresponding current input type sense amplifiers, delay times for the separate groups of input signals can be controlled independently from the other. Therefore, it is possible to output the selected input signal with high timing resolution and with a high speed without regard to the positive logic inputs or the negative logic inputs.

BEST MODE FOR CARRYING OUT THE INVENTION

An embodiment of the present invention is explained in the following.

Figure 1:
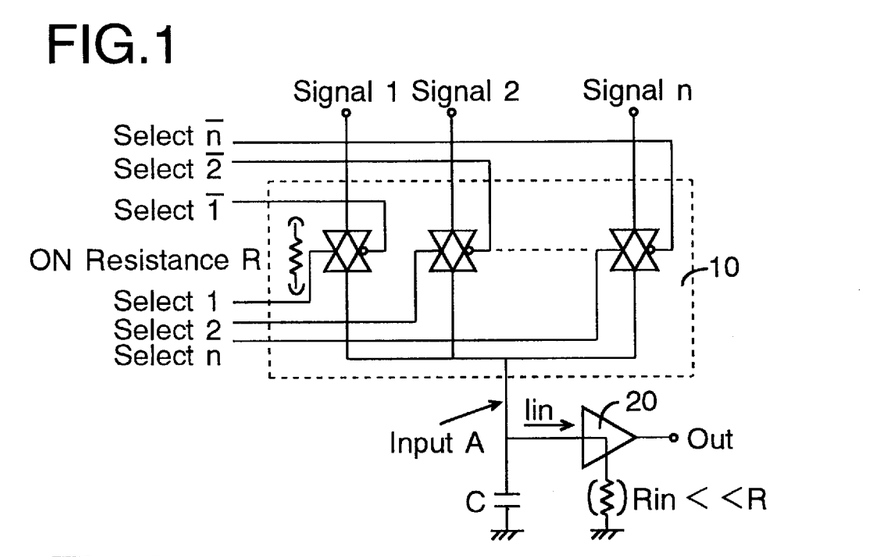
FIG. 1 is a block diagram showing a circuit of an embodiment of the present invention.

FIG. 1 shows a first embodiment of the present invention. This circuit is formed of an input signal selection circuit 10 which selects one input signal out of n input signals, and a current input type sense amplifier 20 which is connected to a wired OR. Since the input impedance of the current input type sense amplifier 20 is almost zero, voltage changes are not caused by input signals. As a result, a current flow to a stray capacitance C at an input point A will not occur, which means that the existence of the stray capacitance is negligible in this example.

In other words, a high speed logic signal selection circuit having high timing resolution is achieved which has no delay times based on the capacitance in the rising and falling edges of an input signal.

Figure 2:
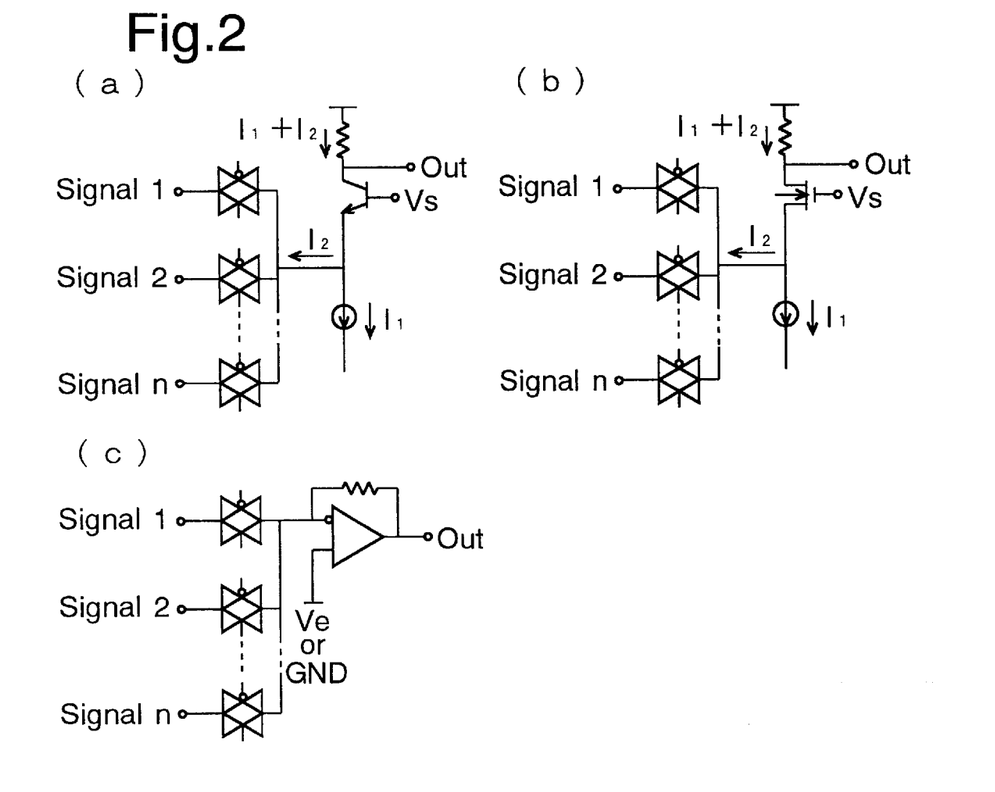
FIG. 2 is a schematic circuit diagram of a current input type sense amplifier of the present invention.

FIG. 2 shows examples of the current input type sense amplifier in which FIG. 2(a) utilizes transistors, FIG. 2(b) utilizes MOSFETs, and FIG. 2(c) utilizes differential amplifiers. In either circuit example, by the selected input signal, an input current to the current input type sense amplifier changes and a voltage output is obtained accordingly.

Figure 3:
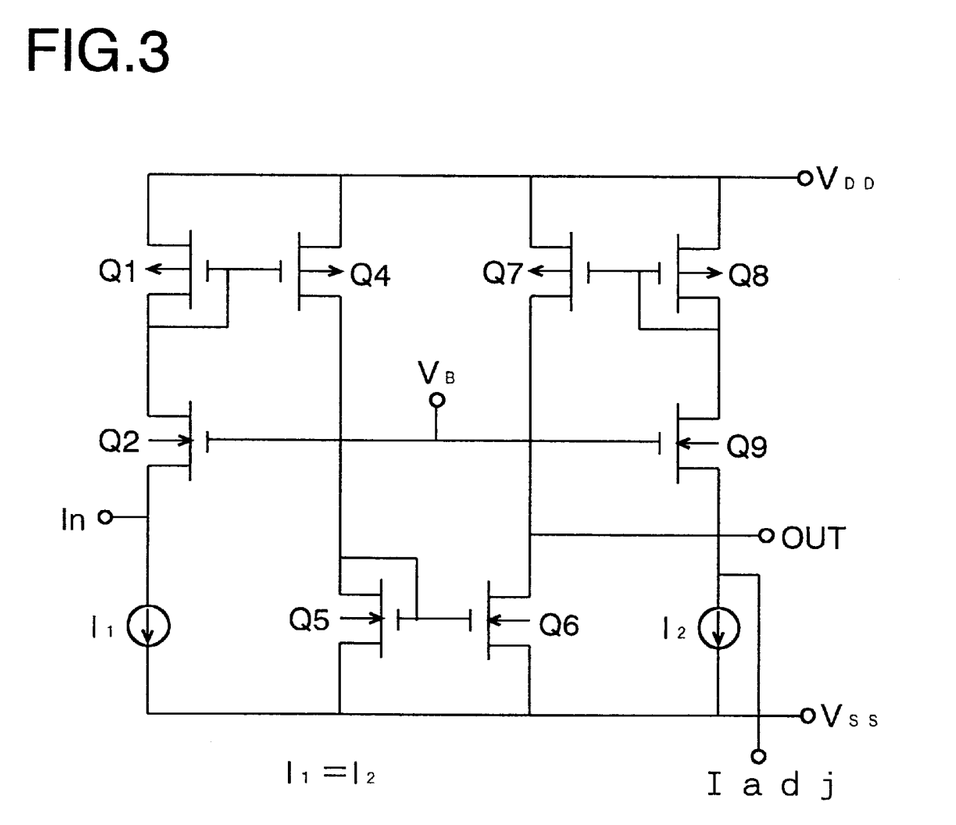
FIG. 3 shows a schematic circuit diagram of another current input type sense amplifier of the present invention.

FIG. 3 shows an example of a current input type sense amplifier which is formed of CMOS transistors. Also in this example, an input current to the current input type sense amplifier changes corresponding to the selected input signal, and a voltage output is obtained accordingly. In this circuit example, by regulating a current to a terminal $I_{adj}$, a threshold current level with respect to the input current is determined. Thus, the delay time of logic signal can be freely regulated.

Further, in this example, it is also possible to delete the transistors Q2 and Q9 and connect the transistors Q1 and Q8 directly to constant current sources $I_1$ and $I_2$, respectively. In such a case, although an input signal voltage varies, delay times in signal rising and falling edges caused by the capacitance are small, since the input impedance is sufficiently small.

Furthermore, in this example, it is also possible to form a current input type sense amplifier by inverting all the P-channels and N-channels of the FETs and voltage sources $V_{DD}$ and $V_{SS}$.

Figure 4:
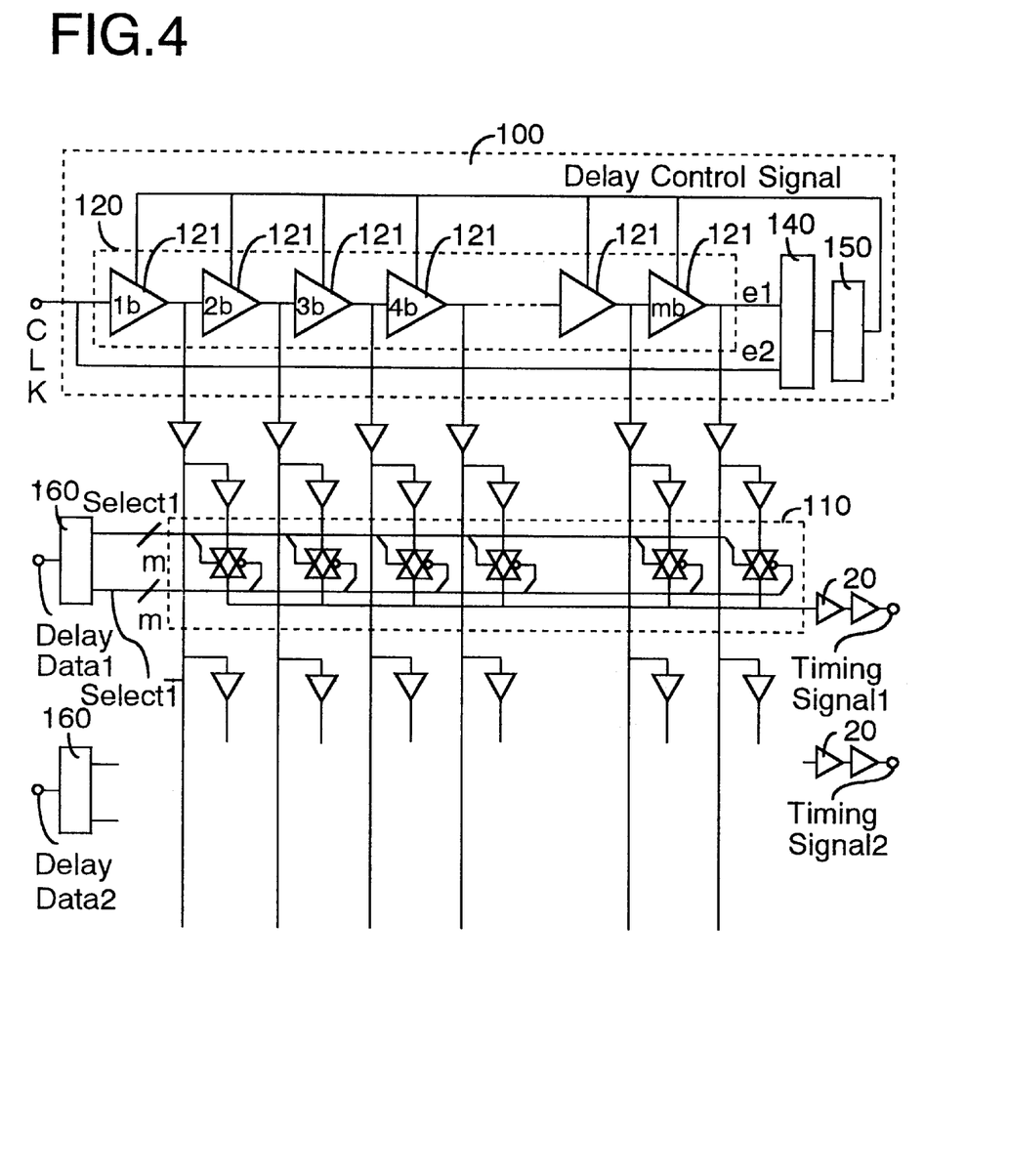
FIG. 4 is a block diagram of a timing signal generator using logic signal selection circuit of the present invention.

Other embodiments are explained in the following. FIG. 4 shows a second embodiment of the present invention. This is a circuit block diagram of a timing signal generation circuit having a logic signal selection circuit. The components in the block diagram of this circuit are classified into the following blocks:

(1) Variable Delay Circuit 120

The variable delay circuit 120 includes m stages of variable delay elements 121 connected in series. In this case, m is a number of timing which divides one clock CLK period. The sum of all the delay times of the m stages of the variable delay elements 121 is controlled to be equal to one clock time by a feedback circuit 150.

(2) Phase Comparator 140

The phase comparator 140 is a circuit which outputs an electric current or voltage signal proportional to a phase difference between signals e1 and e2 supplied to two input terminals. A charge pump may be included in the phase comparator 140. The signal e1 is an output of the last stage of the variable delay circuit 120 which is delayed by one clock period from the clock signal CLK, and the signal e2 is the clock signal CLK.

(3) Feedback Circuit 150

The feedback circuit 150 is to determine a frequency characteristics of a phase lock loop 100 formed of the variable delay circuit 120, the phase comparator 140 and the feedback circuit 150.

(4) Input Signal Selection Circuit 110

The input signal selection circuit 110 is to select one output signal out of m output signals from the variable delay elements 121 in the variable delay circuit 120 to be generated as a timing signal through a current input type sense amplifier 20.

(6) Decoder 160

The decoder 160 generates a select signal based on the delay data for selecting one signal out of the m output signals from the variable delay elements 121 in the variable delay circuit 120.

In order to generate the fine delay time having a resolution of 1/m of the clock signal period, a phase lock loop circuit 100 controls the delay times in the variable delay elements 121 in the variable circuit 120 so that the delay time of one variable delay element is equal to 1/m of the period of the clock signal CLK. Therefore, an overall delay time by the variable delay elements 121 is equal to one clock period of the clock CLK.

The outputs of the variable delay elements 121 of the variable delay circuit 120 have the timing difference which is divided the clock CLK by m. One of these outputs is selected by the input signal selection circuit 110 and is input to the current input type sense amplifier whereby converted to a voltage signal and output therefrom. The timing signals obtained by the outputs of the variable delay elements have high timing accuracy and thus, the timing signal generation circuit of this embodiment having the input signal selection circuit and the current input type sense amplifier 20 can accomplish sufficient timing resolution.

Another embodiment of the present invention is explained in the following.

Figure 5:
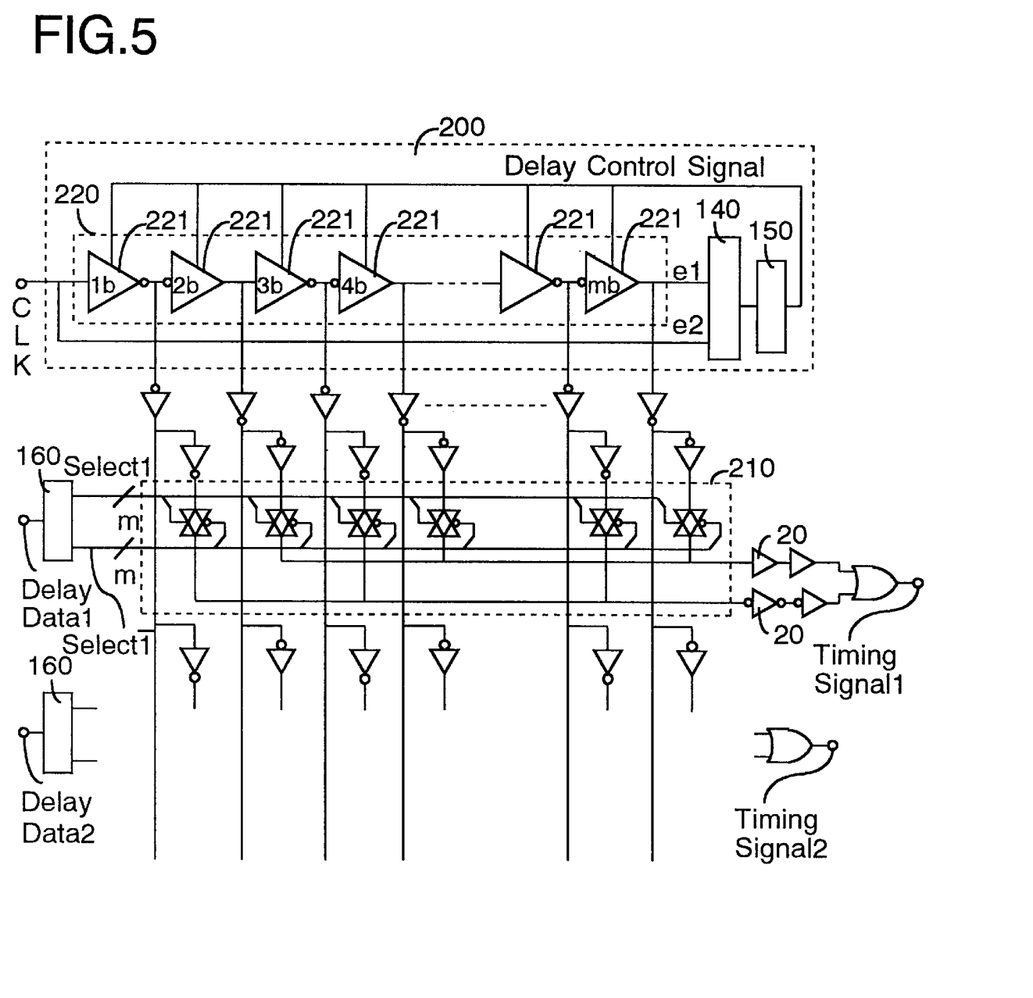
FIG. 5 is a block diagram of the timing signal generator in which positive logic inputs and negative logic inputs are separately provided in accordance with the present invention.

In case where inverters are employed as variable delay elements 221, a timing signal generation circuit is configured as shown in FIG. 5. In this situation, signals to be selected alternately show positive logic or negative logic at the output of the inverters and are input to an input signal selection circuit 210. To maintain the high timing resolution with a high operation speed, the positive logic input signals and the negative logic input signals are grouped and provided to corresponding current input type sense amplifiers separately provided with each other. The outputs of the logic in both sense amplifiers are adjusted by differential amplifiers.

FIG. 6 is a block diagram showing an example of a logic signal selection circuit in which input signals are separated to a positive logic input signal group and a negative logic input signal group. This circuit example has a current input type sense amplifier 320 which is provided with a threshold value which is an output of an equivalent center current generator 310 and positive logic input signals through transfer gates, a current input type sense amplifier 321 which is provided with a threshold value which is an output of an equivalent center current generator 311 and negative logic input signals through transfer gates, a differential amplifier 340 which receives and amplifies an output of the current input type sense amplifier 320 whose delay times are fine adjusted by a delay time adjuster 330, a differential amplifier 341 which receives and amplifies an output of the current input type sense amplifier 321 whose delay times are fine adjusted by a delay time adjuster 331, and a logic circuit 350 which receives both outputs of the differential amplifiers 340 and 341, and generates a logical sum of the both outputs.

INDUSTRIAL APPLICABILITY

Since it is configured as described in the foregoing, the present invention has the following effects.

Because there is no voltage change in the input of the current input type sense amplifier, current flows will not occur to the capacitance C of the transfer gates which are in the OFF state and are connected at the input of the current input type sense amplifier. Thus, it is able to output the selected input signal with high timing resolution and with a high speed.

Further, by classifying the positive logic inputs and the negative logic inputs in separate groups, and providing such separately grouped inputs to the corresponding current input type sense amplifiers, delay times for the separate groups of input signals can be controlled independently from the other. Therefore, it is possible to output the selected input signal with high timing resolution and with a high speed without regard to the positive logic inputs or the negative logic inputs.

The above noted features of the present invention are especially useful for timing signal generation circuits which need to have high timing resolution.

What is claimed is:

1. A logic signal selection circuit comprising:
   a first current input type sense amplifier (320) which is provided with a first threshold value which is an output of a first equivalent center current generator (310) and positive logic input signals through transfer gates;
   a second current input type sense amplifier (321) which is provided with a second threshold value which is an output of a second equivalent center current generator (311) and negative logic input signals through transfer gates;
   a first differential amplifier (340) which receives and amplifies an output of the first current input type sense amplifier (320) whose delay times are fine adjusted by a first delay time adjuster (330);
   a second differential amplifier (341) which receives and amplifies an output of the second current input type sense amplifier (321) whose delay times are fine adjusted by a second delay time adjuster (331); and
   a logic circuit (350) which receives both outputs of the first and second differential amplifiers (340, 341), and generates an output signal which is a logical sum of the both outputs.

2. A logic signal selection circuit for selecting a logic signal from a plurality of logic signals, comprising:
   a plurality of transfer gates corresponding to the plurality of logic signals, an input of each of the transfer gates receives one of the plurality of logic signals and an output of each of the transfer gates is connected with one another in a wired OR fashion; and
   a current sense amplifier which has an input resistance smaller than an ON resistance of each of the transfer gates, the current sense amplifier converting an input current received from an output of the wired OR of the transfers gate into a voltage proportional to the current.

3. A logic signal selection circuit as defined in claim 2, wherein each of the transfer gates is a CMOS transfer gate having input and output terminals for the logic signal passing therebetween and a select terminal for receiving a selection signal to ON/OFF control the transfer gate.

4. A logic signal selection circuit as defined in claim 2, wherein the current sense amplifier is connfigured by a tansistor which forms a common base amplifier wherein a base of the transistor is connected to the ground and the input current from the transfer gate is received by an emitter of the transistor while an output voltage proportional to the input current is produced at a collector of the transistor.

5. A logic signal selection circuit as defined in claim 2, wherein the current sense amplifier is configured by a MOS field effect transistor (MOSFET) which forms a common gate amplifier wherein a gate of the MOSFET is connected to the ground and the input current from the transfer gate is received by a source of the MOSFET while an output voltage proportional to the input current is produced at a drain of the MOSFET.

6. A logic signal selection circuit as defined in claim 2, wherein the current sense amplifier is configured by a differential amplifier having a negative feedback loop wherein the input current from the transfer gate is received by an inverting input terminal of the differential amplifier while a non-inverting input terminal of the differential amplifier is connected to the ground.

7. A logic signal selection circuit, comprising:
   a plurality of variable delay devices serially connected with one another, each variable delay device having a propagation time delay which is substantially smaller than one period of a clock signal;
   a phase comparator which compares a total delay time of the plurality of variable delay devices derived from the last stage of the variable delay devices with the clock signal and generates a voltage signal representing a time difference between the two;
   a feedback circuit which returns the voltage signal from the phase comparator to the variable delay devices to form a phase locked loop so that the total delay time of the variable delay devices is regulated to be equal to the one period of the clock signal;
   a plurality of transfer gates corresponding to the plurality of the delay devices; an input of each of the transfer gates receiving an output current of corresponding one of the delay devices and an output of each of the transfer gates being connected with one another in a wired OR fashion; one of the transfer gates being selected to transfer the output current from one of the delay devices to the wired OR; and
   a current sense amplifier which has an input resistance smaller than an ON resistance of each of the transfer gates, the current sense amplifier converting the output current of the delay device received from the wired OR into a voltage proportional to the input current.

8. A logic signal selection circuit as defined in claim 7, wherein each of the transfer gates is a CMOS transfer gate having input and output terminals for the output current of the delay device passing therebetween and a select terminal for receiving a selection signal to ON/OFF control the transfer gate.

9. A logic signal selection circuit as defined in claim 7, wherein the current sense amplifier is configured by a transistor which forms a common base amplifier wherein a base of the transistor is connected to the ground and the output current from the transfer gate is received by an emitter of the transistor while an output voltage proportional to the output current is produced at a collector of the transistor.

10. A logic signal selection circuit as defined in claim 7, wherein the current sense amplifier is configured by a MOS field effect transistor (MOSFET) which forms a common gate amplifier wherein a gate of the MOSFET is connected to the ground and the output current from the transfer gate is received by a source of the MOSFET while an output voltage proportional to the output current is produced at a drain of the MOSFET.

11. A logic signal selection circuit as defined in claim 7, wherein the current sense amplifier is configured by a differential amplifier having a negative feedback loop wherein the output current from the transfer gate is received by an inverting input terminal of the differential amplifier while a non-inverting input terminal of the differential amplifier is connected to the ground.

12. A logic signal selection circuit, comprising:
   a plurality of variable delay devices serially connected one another, each variable delay device having a propagation time delay which is substantially smaller than one period of a clock signal;

a phase comparator which compares a total delay time of the plurality of variable delay devices derived from the last stage of the variable delay devices with the clock signal and generates a voltage signal representing a time difference between the two;

a feedback circuit which returns the voltage signal from the phase comparator to the variable delay devices to form a phase locked loop so that the total delay time of the variable delay devices is regulated to be equal to the one period of said clock signal;

a first group of transfer gates for receiving output currents of a first group of the variable delay devices, an output of each of the first group of the transfer gates being connected with one another to form a first wired OR; one of the first group of the transfer gates being selected to transfer the output current from one of the first group of the delay devices to the first wired OR;

a second group of transfer gates for receiving output currents of a second group of the variable delay devices, an output of each of the second group of the transfer gates being connected with one another to form a second wired OR; one of the second group of the transfer gates being selected to transfer the output current from one of the second group of the delay devices to the second wired OR;

a first current sense amplifier for converting the output current of one of the first group of the delay devices received from the first wired OR into a first voltage proportional to the output current;

a second current sense amplifier for converting the output current of one of the second group of the delay devices received from the second wired OR into a second voltage proportional to the output current; and an OR gate for receiving the first voltage from the first current sense amplifier and the second voltage from the second current sense amplifier and producing either of the voltages at an output terminal.

13. A logic signal selection circuit as defined in claim 12, wherein an output of each of the first group of the delay devices produces a positive logic signal and an output of each of the second group of the delay devices produces a negative logic signal.

14. A logic signal selection circuit as defined in claim 12, wherein each of the first and second groups of the transfer gates is a CMOS transfer gate having input and output terminals for the output current of the delay device passing therebetween and a select terminal for receiving a selection signal to ON/OFF control the transfer gate.

15. A logic signal selection circuit as defined in claim 12, wherein each of the first and second current sense amplifiers is configured by a transistor which forms a common base amplifier wherein a base of the transistor is connected to the ground and the output current from the transfer gate is received by an emitter of the transistor while an output voltage proportional to the output current is produced at a collector of the transistor.

16. A logic signal selection circuit as defined in claim 12, wherein each of the first and second current sense amplifiers is configured by a MOS field effect transistor (MOSFET) which forms a common gate amplifier wherein a gate of the MOSFET is connected to the ground and the output current from the transfer gate is received by a source of the MOSFET while an output voltage proportional to the output current is produced at a drain of the MOSFET.

17. A logic signal selection circuit as defined in claim 12, wherein each of the first and second current sense amplifiers is configured by a differential amplifier having a negative feedback loop wherein the output current from the transfer gate is received by an inverting input terminal of the differential amplifier while a non-inverting input terminal of the differential amplifier is connected to the ground.

* * * * *